US012754482B2

(12) United States Patent
Rosenthal

(10) Patent No.: US 12,754,482 B2
(45) Date of Patent: Oct. 6, 2026

(54) FIELD MIRRORS FOR IMAGING FIELD COMPRESSION DRIVEN PHOTON EFFICIENCY AND IMAGING WAVEFRONT IMPROVEMENT

(71) Applicant: KLA Corporation, Milpitas, CA (US)

(72) Inventor: Alon Rosenthal, Weston, CT (US)

(73) Assignee: KLA Corporation, Milpitas, CA (US)

( * ) Notice: Subject to any disclaimer, the term of this patent is extended or adjusted under 35 U.S.C. 154(b) by 124 days.

(21) Appl. No.: 18/956,951

(22) Filed: Nov. 22, 2024

(65) Prior Publication Data

US 2025/0355362 A1 Nov. 20, 2025

Related U.S. Application Data

(60) Provisional application No. 63/648,186, filed on May 16, 2024.

(51) Int. Cl.
*G03F 7/00* (2006.01)

(52) U.S. Cl.
CPC ........ *G03F 7/7015* (2013.01); *G03F 7/70191* (2013.01); *G03F 7/7065* (2013.01)

(58) Field of Classification Search
CPC .. G03F 7/7015; G03F 7/70191; G03F 7/7065; G03F 1/24; G03F 1/84; G03F 1/22; G03F 7/70033; G01N 21/956; G01N 2021/95676
See application file for complete search history.

(56) References Cited

U.S. PATENT DOCUMENTS

| | | | |
|---|---|---|---|
| 8,624,971 | B2 | 1/2014 | Brown et al. |
| 8,692,986 | B2 | 4/2014 | Chuang et al. |
| 9,151,718 | B2 | 10/2015 | Wang et al. |
| 9,151,881 | B2 | 10/2015 | Wang et al. |
| 9,348,214 | B2 | 5/2016 | Wang et al. |
| 9,448,343 | B2 | 9/2016 | Kvamme et al. |
| 9,544,984 | B2 | 1/2017 | Bykanov et al. |
| 9,851,256 | B2 | 12/2017 | Steffanson et al. |
| 9,891,177 | B2 | 2/2018 | Vazhaeparambil et al. |
| 10,893,599 | B2 | 1/2021 | Kuritsyn et al. |
| 11,293,880 | B2 | 4/2022 | Juschkin et al. |
| 11,499,924 | B2 | 11/2022 | Juschkin et al. |
| 2009/0040586 | A1 | 2/2009 | Kim et al. |
| 2014/0092283 | A1 | 4/2014 | Yang et al. |

(Continued)

OTHER PUBLICATIONS

Korean Intellectual Property Office, International Search Report and Written Opinion received in International Application No. PCT/US2025/028358, Sep. 5, 2025, 9 pages.

*Primary Examiner* — Mesfin T Asfaw
(74) *Attorney, Agent, or Firm* — Suiter Swantz IP

(57) ABSTRACT

Collected light may be split into fields using grazing incidence mirrors to avoid illuminating gaps between the active areas for readout electronics. The grazing incidence mirrors may reduce lost field space in the integrating direction by splitting the imaging field in that direction to allow the readout electronics to be outside of the field. The fields may be split so there is space for readout circuits but no associated light on the readout circuits. The size of the illumination may then be decreased and/or the number and/or size of sensors increased to improve the photon collection efficiency. The better photon collection efficiency may reduce shot noise and/or improves tool throughput.

24 Claims, 12 Drawing Sheets

(56) References Cited

U.S. PATENT DOCUMENTS

| | | | |
|---|---|---|---|
| 2014/0168758 | A1 | 6/2014 | Rose et al. |
| 2014/0375981 | A1 | 12/2014 | Wang et al. |
| 2022/0224848 | A1 * | 7/2022 | Liu ...................... H04N 25/772 |
| 2023/0121748 | A1 * | 4/2023 | Lee ........................... G03F 1/22<br>250/372 |
| 2024/0089620 | A1 | 3/2024 | Liu et al. |

* cited by examiner

100

FIELD MIRRORS FOR IMAGING FIELD COMPRESSION DRIVEN PHOTON EFFICIENCY AND IMAGING WAVEFRONT IMPROVEMENT

CROSS-REFERENCE TO RELATED APPLICATIONS

The present application claims the benefit under 35 U.S.C. § 119 (e) of U.S. Provisional Application Ser. No. 63/648,186, filed May 16, 2024, titled "FIELD MIRRORS FOR IMAGING FIELD COMPRESSION DRIVEN PHOTON EFFICIENCY AND IMAGING WAVEFRONT IMPROVEMENT", which is incorporated herein by reference in the entirety.

TECHNICAL FIELD

The present disclosure generally relates to inspection systems, and, more particularly, to extreme ultraviolet (EUV) inspection systems.

BACKGROUND

Photomask inspection generally employs ultra-violet (UV) light with wavelengths at or above 193 nanometers (nm). This is suitable for masks designed for use in lithography based on 193 nm light. To further improve the printing of minimum feature sizes, next generation lithographic equipment is designed for operation about 13.5 nm. Accordingly, patterned masks designed for operation near 13.5 nm must be inspected. The EUV spectral range, however, presents challenges when designing an inspection tool due to the short wavelength, energetic photons, and low radiance (brightness) of laboratory (i.e., relatively compact) EUV radiation sources. High-throughput operation of mask inspection systems with low brightness plasma sources (discharge or laser produced) drives the need for large object fields and detector arrays, to increase the rate of signal integration. Therefore, it would be advantageous to provide a device, system, and method that cures the shortcomings described above.

SUMMARY

An inspection system is described, in accordance with one or more embodiments of the present disclosure. The inspection system may include: one or more grazing incidence mirrors, wherein the one or more grazing incidence mirrors are configured to split a collected light into at least two fields, wherein the at least two fields include one or more reflected fields, wherein the one or more grazing incidence mirrors are disposed in a path of the one or more reflected fields such that the one or more reflected fields reflect from the one or more grazing incidence mirrors; and a detector, wherein the detector is configured to generate one or more images from the at least two fields, wherein the detector includes a plurality of time-delay-integration sensors, wherein the plurality of time-delay-integration sensors include a plurality of active areas and a plurality of readout circuits, wherein the plurality of active areas are arranged in an array of columns and rows, wherein the at least two fields are configured to land on separate of the columns of the plurality of active areas, wherein at least a portion of the detector between the columns of the plurality of active areas does not receive the collected light, wherein the plurality of readout circuits are configured to readout charges from the plurality of active areas as lines of the one or more images.

An inspection system is described, in accordance with one or more embodiments of the present disclosure. The inspection system may include: a source sub-system configured to emit illumination, wherein the illumination is vacuum ultraviolet light; illumination optics configured to direct the illumination to a sample, wherein the illumination is configured to reflect from the sample as collected light; a stage, wherein the stage is configured to support the sample; imaging optics configured to direct the collected light to one or more grazing incidence mirrors, wherein the imaging optics magnify the collected light; the one or more grazing incidence mirrors, wherein the one or more grazing incidence mirrors are configured to split the collected light into at least two fields, wherein the at least two fields include one or more reflected fields, wherein the one or more grazing incidence mirrors are disposed in a path of the one or more reflected fields such that the one or more reflected fields reflect from the one or more grazing incidence mirrors; a detector, wherein the detector is configured to generate one or more images from the at least two fields, wherein the detector includes a plurality of time-delay-integration sensors, wherein the plurality of time-delay-integration sensors include a plurality of active areas and a plurality of readout circuits, wherein the plurality of active areas are arranged in an array of columns and rows, wherein the at least two fields are configured to land on separate of the columns of the plurality of active areas, wherein at least a portion of the detector between the columns of the plurality of active areas does not receive the collected light, wherein the plurality of readout circuits are configured to readout charges from the plurality of active areas as lines of the one or more images; and a controller configured to receive the one or more images and detect one or more defects based on the one or more images.

A method is described in accordance with one or more embodiments of the present disclosure. The method may include: splitting a collected light into at least two fields, wherein the collected light is split into the at least two fields using one or more grazing incidence mirrors, wherein the at least two fields include one or more reflected fields, wherein the one or more grazing incidence mirrors are disposed in a path of the one or more reflected fields such that the one or more reflected fields reflect from the one or more grazing incidence mirrors; and generating one or more images from the at least two fields, wherein the one or more images are generated using a detector, wherein the detector includes a plurality of time-delay-integration sensors, wherein the plurality of time-delay-integration sensors include a plurality of active areas and a plurality of readout circuits, wherein the plurality of active areas are arranged in an array of columns and rows, wherein the at least two fields are configured to land on separate of the columns of the plurality of active areas, wherein at least a portion of the detector between the columns of the plurality of active areas does not receive the collected light, wherein the plurality of readout circuits are configured to readout charges from the plurality of active areas as lines of the one or more images.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the description and drawings serve to explain the principles of the disclosure.

BRIEF DESCRIPTION OF THE DRAWINGS

The numerous advantages of the disclosure may be better understood by those skilled in the art by reference to the accompanying figures in which.

DETAILED DESCRIPTION

The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure. Reference will now be made in detail to the subject matter disclosed, which is illustrated in the accompanying drawings.

Embodiments of the present disclosure are directed to field mirrors for imaging field compression driven photon efficiency and imaging wavefront improvement. Collected light may be split into fields using grazing incidence mirrors to avoid illuminating gaps between the active areas for readout electronics. The grazing incidence mirrors may reduce lost field space in the integrating direction by splitting the imaging field in that direction to allow the readout electronics to be outside of the field. The fields may be split so there is space for readout circuits but no associated light on the readout circuits. The size of the illumination may then be decreased and/or the number and/or size of sensors increased to improve the photon collection efficiency. The better photon collection efficiency may reduce shot noise and/or improves tool throughput.

U.S. Pat. No. 8,624,971B2, titled "TDI sensor modules with localized driving and signal processing circuitry for high speed inspection"; U.S. Pat. No. 8,692,986B2, titled "EUV high throughput inspection system for defect detection on patterned EUV masks, mask blanks, and wafers"; U.S. Pat. No. 9,151,718B2, titled "Illumination system with time multiplexed sources for reticle inspection"; Pat. No. 9,151,881B2, titled "Phase grating for mask inspection system"; U.S. Pat. No. 9,348,214B2, titled "Spectral purity filter and light monitor for an EUV reticle inspection system"; U.S. Pat. No. 9,448,343B2, titled "Segmented mirror apparatus for imaging and method of using the same"; U.S. Pat. No. 9,544,984B2, titled "System and method for generation of extreme ultraviolet light"; U.S. Pat. No. 9,891,177B2, titled "TDI sensor in a darkfield system"; U.S. Pat. No. 10,893,599B2, titled "Laser produced plasma light source having a target material coated on a cylindrically-symmetric element"; U.S. Pat. No. 11,293,880B2, titled "Method and apparatus for beam stabilization and reference correction for EUV inspection"; U.S. Pat. No. 11,499,924B2, titled "Determining one or more characteristics of light in an optical system"; U.S. Patent Publication Number US20140168758A1, titled "Carbon as grazing incidence euv mirror and spectral purity filter"; are each incorporated herein by reference in the entirety.

Figure 1:
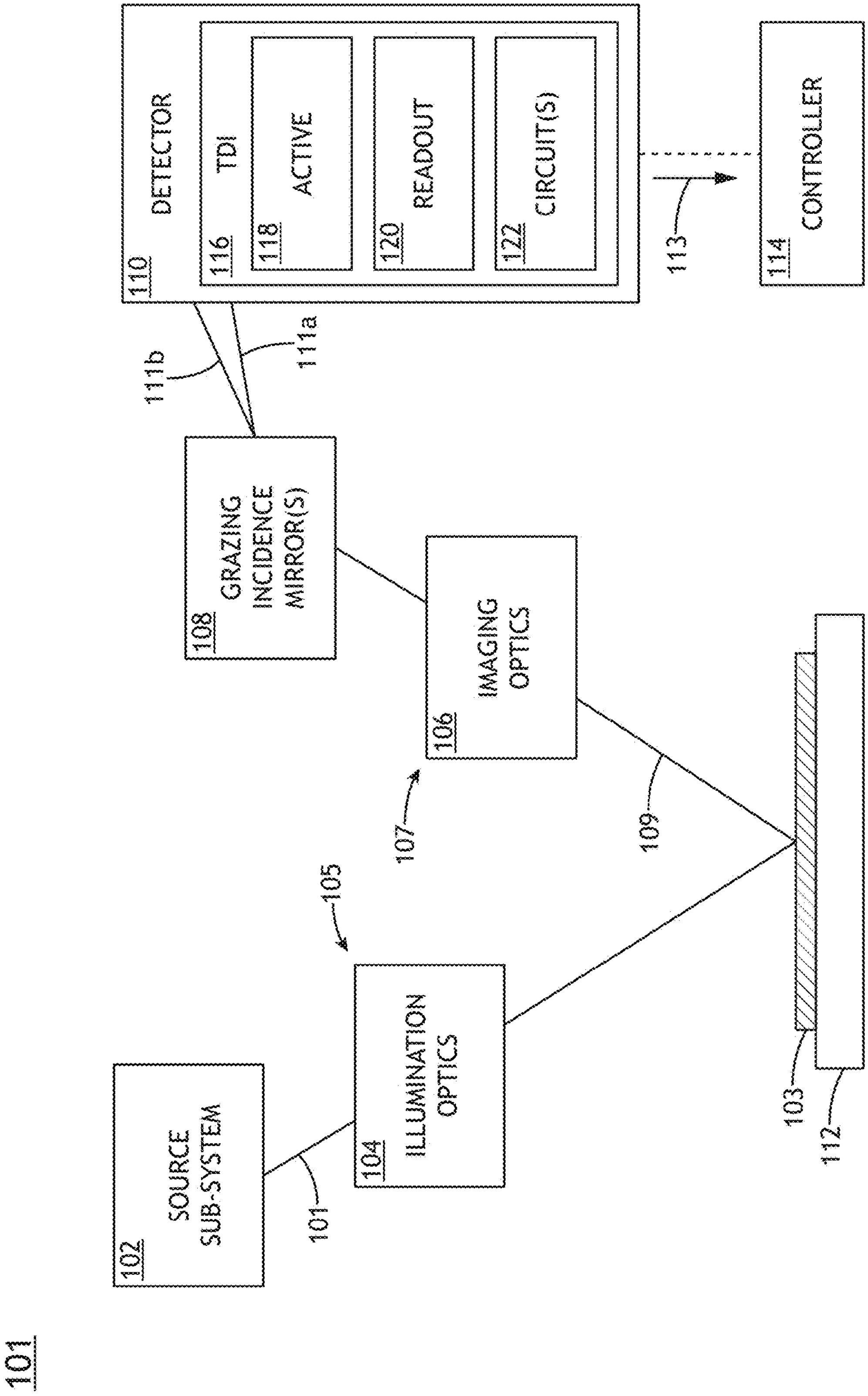
FIG. 1 depicts a simplified block diagram of an inspection system, in accordance with one or more embodiments of the present disclosure.

FIG. 1 depicts an inspection system 100, in accordance with one or more embodiments of the present disclosure. The inspection system 100 may include a source sub-system 102, illumination optics 104, imaging optics 106, grazing incidence mirrors 108, detector 110, a stage 112, and/or a controller 114.

The source sub-system 102 may be configured to emit illumination 101. The illumination 101 may include vacuum ultraviolet (VUV) light. When using the VUV light, the inspection system 100 may operate in a vacuum to prevent the atmosphere from absorbing the illumination 101. The VUV light may have a wavelength of between 10 nm and 200 nm. The VUV light may be far ultraviolet (FUV) light and/or extreme ultraviolet (EUV) light. The FUV light may have a wavelength of between 121 and 200 nm. The EUV light may have a wavelength of between 10 nm and 121 nm. In embodiments, the illumination 101 may be in-band EUV light having a wavelength of 13.5 nm. For example, the in-band EUV light may have a wavelength of 13.5 nm with 2% bandwidth. Although the illumination 101 is described as the in-band EUV light, VUV light at other wavelength ranges may also be used.

The source sub-system 102 may include one or more components (not depicted) by which the source sub-system 102 is configured to emit the illumination 101. For example, the source sub-system 102 may include an illumination source, a VUV emitter, and the like. The illumination source may include laser-produced plasma sources, discharge-produced plasma sources, and the like. The illumination source may be a pulsed or modulated illumination source. The VUV emitter may be an EUV emitter. The source sub-system 102 may also include multiple VUV emitters which are multiplexed together. For example, the emitters may be multiplexed together via a multiplexing mirror system. Multiplexing the emitters together may be beneficial to increase a power and/or brightness of the illumination 101.

The inspection system 100 may be configured to inspect the sample 103. The illumination 101 may be directed to a sample 103. The sample 103 may include a mask blank, a photomask, a wafer (e.g., semiconductor wafer), a die, or the like. The photomask may also be referred to as a reticle. The sample 103 may be, for example, a photomask used in extreme ultraviolet (EUV) lithography.

The inspection system 100 may be configured to direct the illumination 101 to the sample 103 along an illumination path 105. The illumination path 105 may include the illumination optics 104 which direct the illumination 101 to the sample 103. The illumination optics 104 may include one or more optical components (not depicted). The optical components may be reflective optics due to the wavelength of the illumination 101. The optical components may process and shape the illumination 101 prior to directing onto the sample 103. For example, the illumination optics 104 may include collector optics, homogenizers, spectral purity filters, relays, condensers, and the like. The collector optics may collect the illumination 101 from the source sub-system 102 and direct the illumination 101 to the sample 103. The homogenizer may change the illumination 101 from a gaussian beam to a flat-top beam. The flat-top beam may also be referred to as a top-hat beam. The spectral purity filter may filter wavelengths (e.g., drive laser wavelengths of the source sub-system 102) from the illumination 101. The relays may relay the illumination 101 between any of the various optical components of the illumination optics 104. The condenser may condense the illumination 101 into a converging beam on the sample 103.

The illumination 101 may reflect from the sample 103 as collected light 109. The collected light 109 may reflect via specular reflection, scattering, diffusion, or the like. The illumination 101 and the collected light 109 may be off-axis when being directed to and reflected from, respectively, the sample 103. The collected light 109 may reflect from the sample 103 off-axis to the illumination 101. The collected light 109 may be patterned light. For example, the collected light 109 may be patterned according to the mask, the wafer, and/or the die of the sample 103. The pattern may also indicate defects associated with the sample 103. The source sub-system 102 may also illuminate the sample 103 via critical illumination. The collected light 109 may be the VUV light, the FUV light, the EUV light, the in-band EUV light, or the like.

The stage 112 may support the sample 103. The stage 112 may be an actuatable stage. The illumination 101 and/or the collected light 109 may be scanned in a scanning direction over the sample 103. The stage 112 may scan the illumination 101 and the collected light 109 in a scanning direction over the sample 103. The sample 103 may be scanned under the illumination 101 and/or the collected light 109 by actuating the stage 112. For example, the stage 112 may include, but is not limited to, one or more translational stages suitable for translating the sample 103 along one or more linear directions (e.g., x-direction, y-direction, and/or z-direction). By way of another example, the stage 112 may include, but is not limited to, one or more rotational stages suitable for rotating the sample 103 along a rotational direction. By way of another example, the stage 112 may include, but is not limited to, a rotational stage and a translational stage suitable for translating the sample 103 along a linear direction and/or rotating the sample 103 along a rotational direction.

The inspection system 100 may be configured to direct the collected light 109 from the sample 103 to the grazing incidence mirrors 108 along an imaging path 107. The imaging path 107 may include the imaging optics 106 which direct the collected light 109 to the grazing incidence mirrors 108. The imaging optics 106 may include one or more optical components (not depicted). The optical components may be reflective optics due to the wavelength of the collected light 109. The imaging optics 106 may optically magnify the collected light 109. In this regard, the imaging optics 106 may be reflective objective mirrors. The imaging optics 106 may include any number of the reflective objective mirrors, such as four or more reflective objective mirrors. The imaging optics 106 may provide a select magnification. The optical magnification provided by the imaging optics 106 to the collected light 109 may be at least one-hundred times. For example, the optical magnification may be between 250 and 1000 times. The field size of the collected light 109 after magnification by the imaging optics 106 may be on the order of tens or hundreds of millimeters. The optical magnification may be selected to for critical sampling scaling with the wavelength divided by the numerical aperture to accommodate a size of the patterns on the sample 103. At increasingly smaller technology nodes, the collected light 109 may be magnified increasingly larger, thereby facilitating detection of the patterns.

The grazing incidence mirrors 108 may be reflective optics. The grazing incidence mirrors 108 may be a last reflective optic in the imaging path 107 before the detector 110. The grazing incidence mirrors 108 may be fixed in position and orientation relative to the detector 110. The grazing incidence mirrors 108 may reflect the collected light 109 from the imaging optics 106 onto the detector 110.

The grazing incidence mirrors 108 may split the collected light 109 from the imaging optics 106 into fields 111. The grazing incidence mirrors 108 may split the collected light 109 from the imaging optics 106 into at least two of the fields 111.

The grazing incidence mirrors 108 may split the collected light 109 from the imaging optics 106 into reflected fields 111*a*. The grazing incidence mirrors 108 may split the collected light 109 from the imaging optics 106 into one or more of the reflected fields 111*a*. The grazing incidence mirrors 108 may be disposed in the path of the reflected fields 111*a* such that the reflected fields 111*a* may reflect from the grazing incidence mirrors 108. In embodiments, the inspection system 100 may include at least two of the grazing incidence mirrors 108 which may split the collected light 109 from the imaging optics 106 into at least two of the reflected fields 111*a*.

The grazing incidence mirrors 108 may also split the collected light 109 from the imaging optics 106 into one or more of the reflected fields 111*a* and an un-reflected field 111*b*. The grazing incidence mirrors 108 may be disposed in the path of the reflected fields 111*a* such that the reflected fields 111*a* may reflect from the grazing incidence mirrors 108. The grazing incidence mirrors 108 may not be disposed in the path of the un-reflected field 111*b* such that the un-reflected field 111*b* may not reflect from the grazing incidence mirrors 108. Notably, the term un-reflected refers to the lack of reflection from the grazing incidence mirrors 108, given that the un-reflected field 111*b* may be reflected from the imaging optics 106. The power of the reflected fields 111*a* may be lower than the un-reflected field 111*b*, due to being reflected by the grazing incidence mirrors 108. The image of the reflected fields 111*a* will also be inverted to the un-reflected field 111*b* due to being reflected.

The grazing incidence mirrors 108 may include any suitable type of grazing incidence mirror configured for reflecting the collected light 109. The grazing incidence mirrors 108 may be configured for reflecting the VUV light, the EUV light, and/or the in-band EUV light having the wavelength of 13.5 nm. For example, the material which configures the grazing incidence mirrors 108 for reflecting the in-band EUV light having the wavelength of 13.5 nm may be ruthenium (Ru), molybdenum (Mo), niobium (Nb), engineered high density carbon films having high Sp3 content (e.g. tetrahedral (Ta—C)), or the like.

The grazing incidence mirrors 108 may be plano mirrors or curved mirrors. In embodiments, the grazing incidence mirrors 108 are plano mirrors. The plano mirrors may be beneficial in allowing the addition of the grazing incidence mirrors 108 between the imaging optics 106 and the detector 110 without modifying the imaging optics 106 of the inspection system 100. Alternatively, the grazing incidence mirrors 108 may be curved mirrors with a modification to the magnification of the imaging optics 106.

The grazing incidence mirrors 108 may be in the path of the collected light 109 from the imaging optics 106 and angled at one or more grazing incidence angles relative to the collected light 109 from the imaging optics 106. The angle at which the reflected fields 111*a* from the grazing incidence mirrors 108 may be based on the grazing incidence angles at which the grazing incidence mirrors 108 are oriented. For example, the grazing incidence angles of the grazing incidence mirrors 108 may be between 0 and 20 degrees. For instance, the grazing incidence angles may be between 5 and 9 degrees. The grazing incidence mirrors 108 may introduce losses to the reflected fields 111*a*. Decreasing the grazing incidence angles may be desirable to reduce a power loss associated with the reflection of the collected light 109 from the imaging optics 106 from the grazing incidence mirrors 108. For example, ruthenium (Ru) may include a reflectivity of 1 at a grazing incidence angle of zero which decreases to a reflectivity of about 0.7 at 20 degrees for the in-band EUV light having the wavelength of 13.5 nm, and with a reflectivity of about 0.92 at 7 degrees.

The detector 110 may include time-delay-integration sensors 116 (TDI sensors). To accomplish faster inspections, the size of the time-delay-integration sensors 116 may be increased. The yield associated with the time-delay-integration sensors 116 decreases with increases in size. For example, the time-delay-integration sensors 116 with too many pixels in the active areas 118 may lose yield. Therefore, the detector 110 may not be made of one large TDI sensor to collect the entire region of the collected light 109 from the imaging optics 106 but an array of the time-delay-integration sensors 116 to collect portions of the collected light 109. The array of the time-delay-integration sensors 116 may increase manufacturability of the detector 110 while decreasing driving and processing requirements relative to a large monolithic device of equivalent area.

The time-delay-integration sensors 116 may include active areas 118 and/or readout circuits 120.

The active areas 118 may each be an array of pixels over which the time-delay-integration sensors 116 are configured to accumulate and integrate charge from the collected light 109. The active areas 118 may include rows and columns of pixels. The active areas 118 may include any number of pixels in the rows and columns. The active areas 118 may be square or an oblong rectangle. The active areas 118 may include a same width and height where the active areas 118 are square. The width of the active areas 118 may longer than the height where the active areas 118 are oblong rectangles.

The active areas 118 may be arranged in an array of rows and columns. The readout circuits 120 may be disposed adjacent to the active areas 118 within the array. The active areas 118 may be arranged in an M-by-N array, where M is an integer number of columns of the active areas 118, and where N is an integer number of rows of the active areas 118. The detector 110 may include at least two of the active areas 118 per column and per row. For example, the integer number M and N may be two, three, four, or more. The detector 110 may or may not include the same number of the active areas 118 in the columns and the rows. For example, the detector 110 may include four of the active areas 118 arranged in a two-by-two array, six of the active areas 118 arranged in a two-by-three array, nine of the active areas 118 arranged in a three-by-three array, or the like.

Where the grazing incidence mirrors 108 splits the collected light 109 from the imaging optics 106 into only the reflected fields 111*a*, the number of the grazing incidence mirrors 108 and the number of the reflected fields 111*a* may be equal to the number M of the columns of the active areas 118. Where the grazing incidence mirrors 108 splits the collected light 109 from the imaging optics 106 into the reflected fields 111*a* and the un-reflected field 111*b*, the number of the grazing incidence mirrors 108 and the number of the reflected fields 111*a* may be one less than the number M of the columns of the active areas 118.

The rows of the active areas 118 may be aligned with adjacent row of the active areas 118. The columns of the active areas 118 may also be aligned with adjacent columns of the active areas 118. The active areas 118 may be configured in a rectangular lattice or a square lattice by maintaining the alignment between the rows and columns of the active areas 118. For example, the detector 110 may be configured in square lattice where the rows and columns of the active areas 118 are spaced equidistant adjacent rows and adjacent columns. The detector 110 may include a spacing between the active areas 118. For example, the active areas 118 may be spaced apart from adjacent of the active areas 118 by the size of the active areas 118.

The field position at the sample 103 imaged by the active areas 118 may be the fields 111. Each of the active areas 118 may be positioned in the same image plane but at different positions within the image plane to separately detect the fields 111. The fields 111 may each land on separate columns and/or rows of the active areas 118.

The fields 111 may be directed to the active areas 118. For example, the grazing incidence mirrors 108 may direct the reflected fields 111*a* to the active areas 118. The grazing incidence angles may be selected for directing the fields 111 based on the relative position to the active areas 118. The grazing incidence mirrors 108 which are closer to the detector 110 may include smaller grazing incidence angles than the grazing incidence mirrors 108 which are further from the detector 110. The grazing incidence angles may increase as the detector 110 includes more columns of the active areas 118. Thus, the number of columns of the detector 110 may be limited by the grazing angle of incidence and associated reflectivity of the grazing incidence mirrors 108.

Portions of the detector 110 between the columns and/or rows of the active areas 118 may not be within the fields 111. At least a portion of the detector 110 between the columns of the active areas 118 does not receive the collected light 109 and/or the fields 111. Splitting the collected light 109 into the fields 111 may reduce the portion of the collected light 109 which falls on the readout circuits 120 and/or in inactive areas between the rows and columns of the active areas 118. For example, using the array of the active areas 118 in the inspection system 100 without the grazing incidence mirrors 108 to split the collected light 109 into the fields 111 may cause the readout circuits 120 and/or in inactive areas between the rows and columns of the active areas 118 to be fully covered by the collected light 109. Thus, the grazing incidence mirrors 108 may cause the detector 110 to collect additional of the collected light 109. The gain associated with collecting additional of the collected light 109 may outweigh the loss associated with the reflection from the grazing incidence mirrors 108. Increasing the gain may be beneficial to reduce the charge integration time of the detector 110 and increase the speed at which the inspection system 100 scans the sample 103.

The detector 110 may be configured to generate images 113 from the fields 111. The time-delay-integration sensors 116 may generate the images 113 of the sample 103 as the illumination 101 is scanned over the sample 103. The fields 111 may be converted to charges in the active areas 118. As the illumination 101 is scanned over the sample 103, the charges are shifted from pixel-to-pixel along the active areas 118 in an integration direction, parallel to the axis of movement, to the readout circuits 120. The readout circuits 120 may readout the charges as lines of the images 113. By synchronizing the charge shift rate with the velocity of the scanning, the time-delay-integration sensors 116 may integrate a signal intensity at a fixed position on the time-delay-integration sensors 116 to generate the images 113. The total integration time may be regulated by changing the velocity of the scanning and providing more/less pixels in the direction of the scanning. The readout circuits 120 may readout charges from respective rows of the active areas 118. The readout circuits 120 may be readout in a line orthogonal to the scanning direction. The line may form sequential lines of the images 113.

The active areas 118 may integrate charge either along the scanning direction or opposite to the scanning direction, with a corresponding position of the readout circuits 120 defined by the direction of integration. The scanning direction may be along the rows. The active areas 118 receiving the reflected fields **111*a* may integrate charges in the scanning direction in which the collected light 109 is scanned over the sample 103. The readout circuits 120 which readout the charges from the active areas 118 receiving the reflected field 111*a* may each be disposed on a same side of the active areas 118. The active areas 118 receiving the un-reflected field 111*b* may integrate charges opposite to the scanning direction, to compensate for the reflection of the reflected fields 111*a* and enable integration along the scanning direction. The readout circuits 120 may also be disposed between the active areas 118. The readout circuits 120 which readout the charges from the active areas 118 receiving the un-reflected field 111*b* may be disposed on the opposite side of the active areas 118, as compared to the readout circuits 120 which readout the charges from the active areas 118 receiving the reflected fields 111*a*, to compensate for the reflection of the reflected fields 111*a*** and enable integration along the scanning direction.

The active areas 118 may be spaced apart from adjacent of the active areas 118 in the columns to provide a space for the readout circuits 120 and/or the reference corrector shadow 124. The active areas 118 may be spaced apart from adjacent of the active areas 118 in the rows to accommodate for a swath pattern. The inspection system 100 may be configured to perform swathing. Swathing may refer to using the TDI's to collect a horizontally long image from one side to the other of the sample. Many horizontal swaths may be combined to cover the entire sample 103 from side to side and top to bottom.

The collected light 109 may be designed to land on the detector 110 with a buffer. The buffer may also be referred to as a margin. The buffer may compensate for non-uniformities at the edge of the collected light 109 caused by the imaging optics 106 and/or to cause the collected light 109 on the active areas 118 to be homogenous. The fields 111 may include a buffer around the active areas 118. The active areas 118 may include the buffer of the collected light 109 along the edges of the fields 111 which are not split by the grazing incidence mirrors 108 and may not include the buffer along the edges of the fields 111 which are split by the grazing incidence mirrors 108.

The grazing incidence mirrors 108 may include a grazing incidence angle which is oriented to split the collected light 109 into the reflected fields **111*a* along the columns and/or the rows of the active areas 118. For example, each of the grazing incidence mirrors 108 may split the collected light 109 from the imaging optics 106 into the reflected fields 111*a* along the columns the active areas 118. In this example, the grazing incidence mirrors 108 may be a singly-curved facet. By way of another example, the grazing incidence mirrors 108 may split the collected light 109 into the reflected fields 111*a* along both the columns and the rows the active areas 118. The reflected fields 111*a* may be configured to land on separate of the columns and separate of the rows. In this example, the grazing incidence mirrors 108** may be a doubly-curved facet.

The size of the collected light 109 in the scanning direction may be the sum of the widths of the active areas 118 plus the buffer for uniform outer illumination patch edges (e.g., not including the space between the active areas 118). The grazing incidence mirrors 108 may support reducing the size of the field size at the sample 103 while keeping the sum of the active areas 118 constant which will improve photon efficiency and make the imaging optics 106 less challenging. Widths of the active areas 118 may also be increased along the scanning direction. The active areas 118 may be placed further apart in the scanning direction for mechanical spacing and/or cooling purposes.

The inspection system 100 may generate the images 113 without performing an interleaving process. In an interleaving process, first sets of lines of the images 113 are generated in a first scan, The sample 103 is then translated perpendicular to the scanning direction by the width of one of the active areas 118, second sets of lines of the images 113 are generated in a second scan, and then the first sets and second sets of the lines are interleaved together to cover each point on the sample 103 once.

The illumination optics 104 may include reference correctors. A portion of the illumination field inside the illumination optics 104 will land on the reference correctors. The reference correctors may then indicate the intensity of pulses of the source sub-system 102. The reference correctors may block light on a portion of the fields 111. For example, the reference correctors may be disposed between one or more rows of the active areas 118 and within at least a portion of the fields 111. The reference correctors may be in the illumination optics 104. The reference correctors may form a reference corrector shadow 124. The reference corrector shadow 124 may be a shadowed portion of the fields 111. The reference corrector shadow 124 may be conjugate to a position between at least two rows of the active areas 118 and within at least a portion of the at least two of the fields 111. The grazing incidence mirrors 108 may split the fields 111 such that the reference corrector shadow 124 does not land on the active areas 118.

The circuits 122 may include also timing circuits, serial drive circuits, pixel gate drive circuits, and the like. The circuits 122 may be localized circuitry for driving and signal processing. The circuits 122 may provide correlated double sampling (CDS) and other analog front end (AFE) functions (e.g. analog gain control), analog-to-digital conversion (ADC), and digital post-processing such as black-level correction, per pixel gain and offset corrections, linearity corrections, look-up tables (LUTs), data compression, and the like. The circuits 122 may control clock timing and drive.

The circuits 122 may include features such as reset pulse generation, multi-phase serial-register clock generation, and ADC synchronization may be included. The circuits 122 may allow for very accurate timing which is needed to achieve high SNR (signal to noise ratio) at high clocking speeds. The circuits 122 may provide slower but higher-current TDI gate drive signals to synchronize data capture with the inspection image motion and with other TDI sensors. The circuits 122 may provide three-phase or four-phase drive waveforms of square-wave and/or sinusoidal waveforms. The circuits 122 may use digital-to-analog conversion to optimize the charge transfer, thermal dissipation, and SNR of the detector 110.

The controller 114 may receive the images 113 from the detector 110. The controller 114 may analyze the images 113 to detect one or more defects on the sample 103 based on the images 113. For example, the controller 114 may subtract the reference images from the images 113 to remove patterns which are supposed to be on the sample 103, leaving only the defects in the images 113.

Figure 2A:
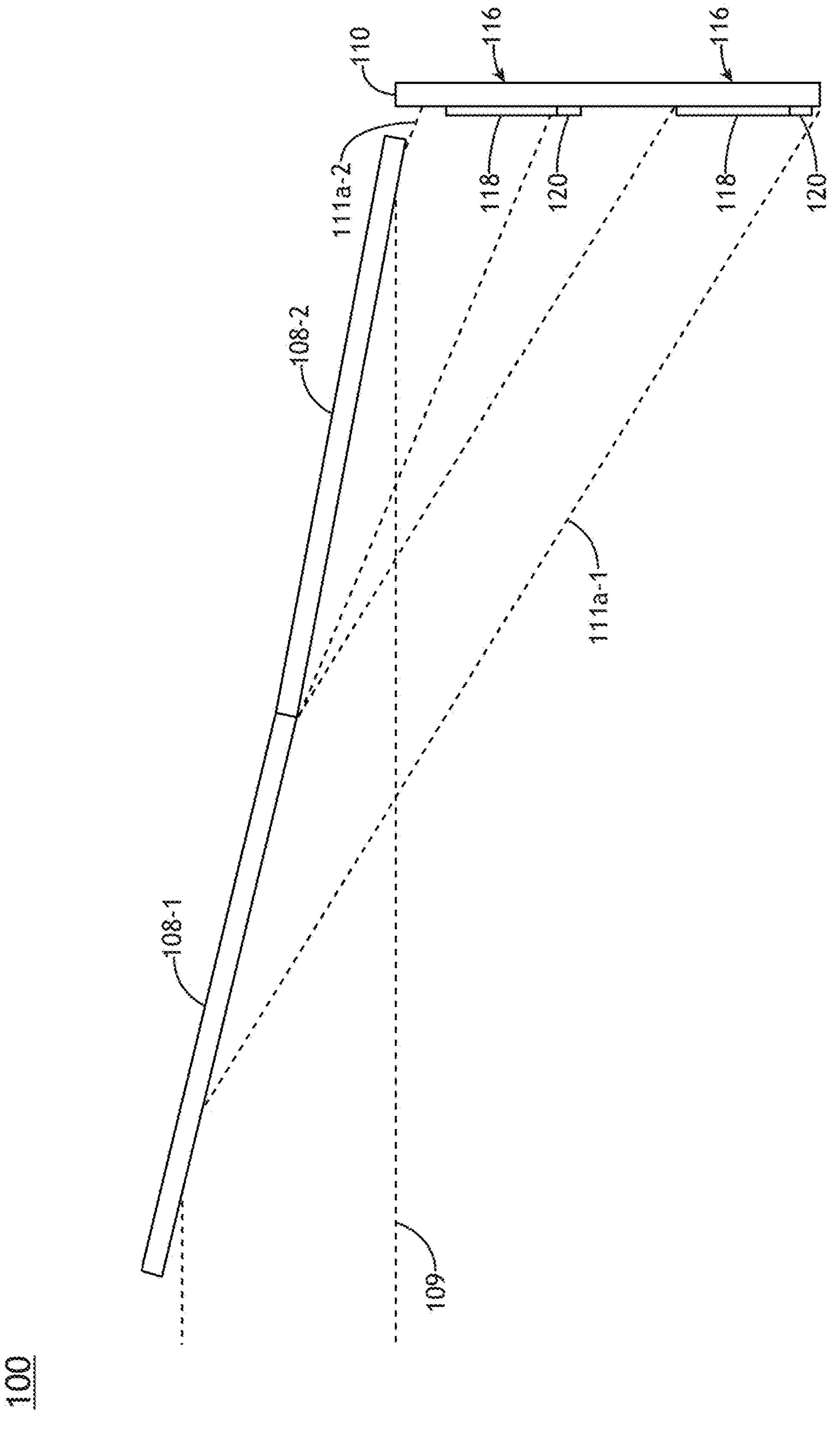
FIG. 2A depicts a top view of grazing incidence mirrors and a detector of the inspection system, in accordance with one or more embodiments of the present disclosure.
Figure 2B:
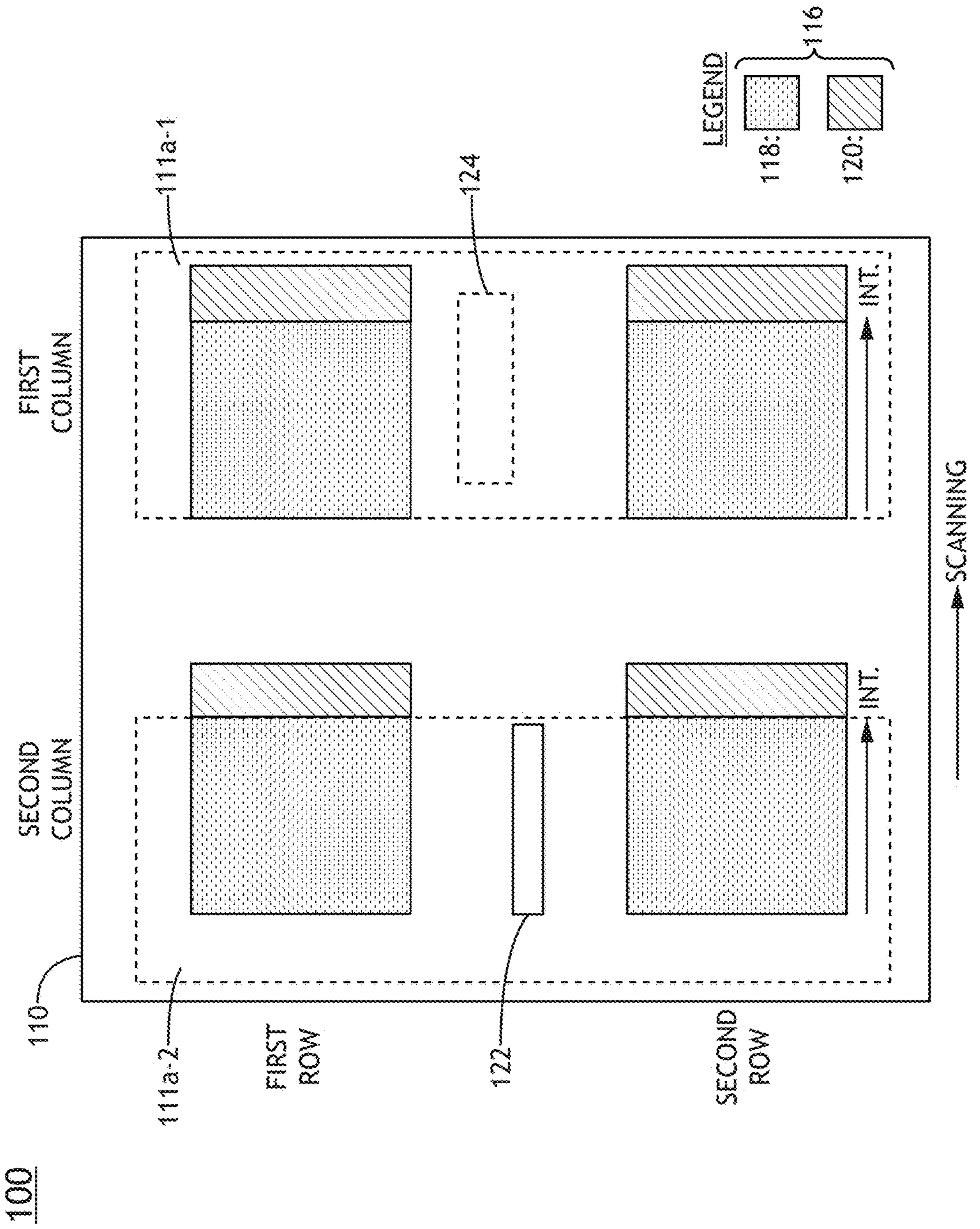
FIGS. 2B-2C depict front views of the detector of the inspection system, in accordance with one or more embodiments of the present disclosure.
Figure 2C:
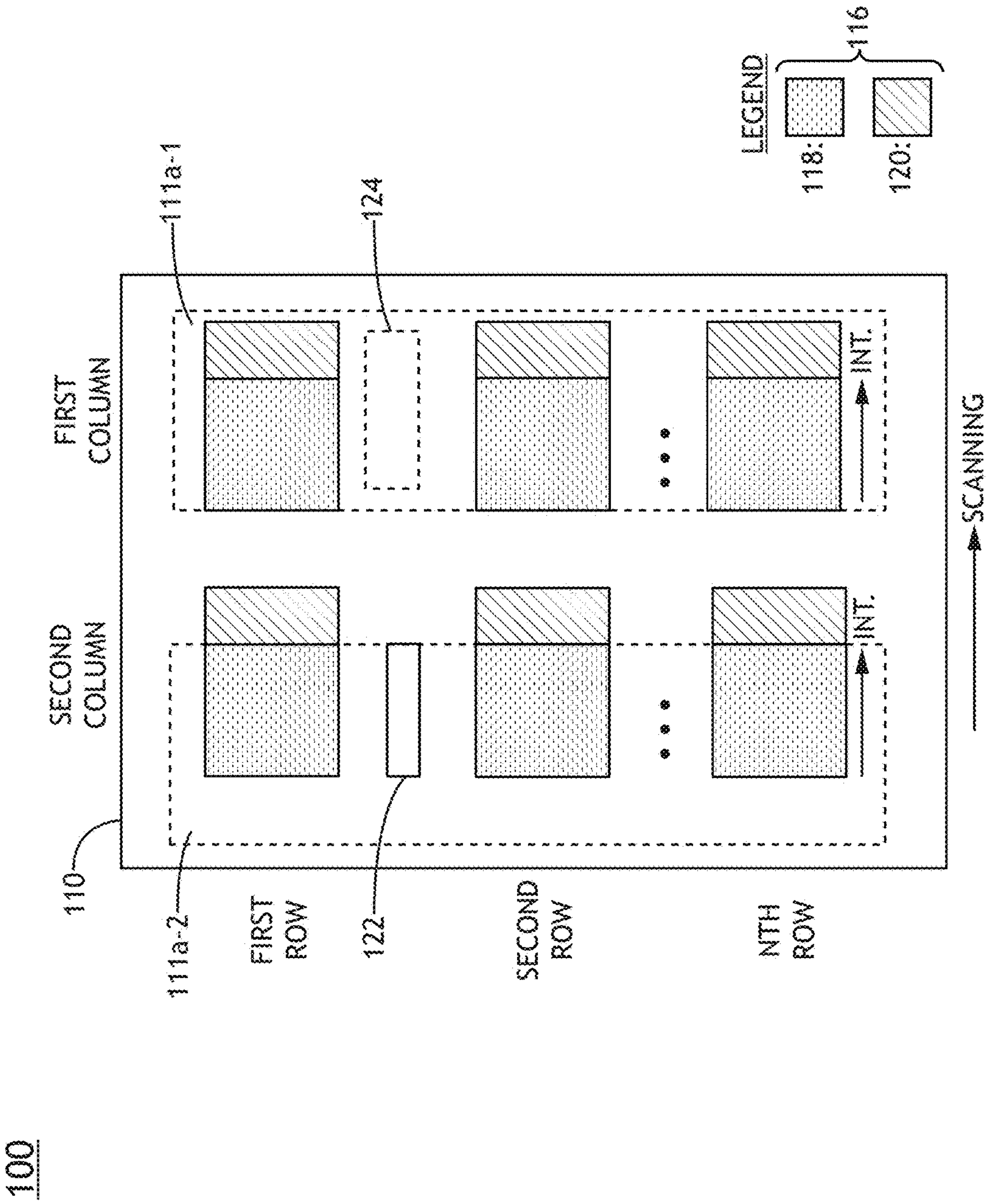

FIGS. 2A-2C depict an example of the inspection system 100 in accordance with one or more embodiments of the present disclosure. The inspection system 100 includes a first grazing incidence mirror 108-1, a second grazing incidence mirror 108-2, and the detector 110 which includes two columns (e.g., first column of active areas 118, second column of active areas 118). The first grazing incidence mirror 108-1 and the second grazing incidence mirror 108-2 are configured as a singly-curved facet. In FIG. 2B, the detector 110 includes two rows of the active areas 118. In FIG. 20, the detector 110 is generalized to any number N of rows of the active areas 118.

The first grazing incidence mirror 108-1 and the second grazing incidence mirror 108-2 may be in the path of the collected light 109 from the imaging optics 106. The first grazing incidence mirror 108-1 and the second grazing incidence mirror 108-2 may be set at different incidence angles to the collected light 109 from the imaging optics 106. The second grazing incidence mirror 108-2 may be at a lesser incidence angle than the first grazing incidence mirror 108-1. The second grazing incidence mirror 108-2 may also be closer to the detector 110 than the first grazing incidence mirror 108-1. The second grazing incidence mirror 108-2 may abut to an end of the first grazing incidence mirror 108-1 within the path of the collected light 109 from the imaging optics 106. The first grazing incidence mirror 108-1 and the second grazing incidence mirror 108-2 may split the collected light 109 into a first reflected field 111*a*-1 and a second reflected field 111*a*-2, respectively.

The first reflected field 111*a*-1 may be reflected from the first grazing incidence mirror 108-1 and land on the first column of active areas 118. The first reflected field 111*a*-1 may be aligned at the edge of the active areas 118 opposite to the interface with the readout circuits 120 of the first column of active areas 118 due to the edge being at the center region of the collected light 109. The readout circuits 120 associated with the first column of active areas 118 may be at least partially within the first reflected field 111*a*-1. The first reflected field 111*a*-1 may include an oversized buffer which includes at least a portion of the readout circuits 120.

The second reflected field 111*a*-2 may be reflected from the second grazing incidence mirror 108-2 and land on the second column of active areas 118. The readout circuits 120 of the second column of active areas 118 may not be within the second reflected field 111*a*-2. The second reflected field 111*a*-2 may be aligned at the interface between the active areas 118 and the readout circuits 120 of the second column of active areas 118 due to the interface being at a center region of the collected light 109. The second reflected field 111*a*-2 may include an oversized buffer at edge of the active areas 118 opposite to the readout circuits 120 of the second column of active areas 118.

In this example, the readout circuits 120 of the second column of active areas 118 may be disposed between the active areas 118 of the first column of active areas 118 and the active areas 118 of the second column of active areas 118. In this example, the active areas 118 follow a same direction over which charge is integrated to the readout circuits 120 due to both the first reflected field 111*a*-1 and the second reflected field 111*a*-2 being reflected.

It is contemplated that one advantage of the inspection system 100 which includes the first grazing incidence mirror 108-1 and the second grazing incidence mirror 108-2 splitting the collected light 109 from the imaging optics 106 into the first reflected field 111*a*-1 and the second reflected field 111*a*-2 may be that at least a portion of the collected light 109 does not land between the first column of active areas 118 and the second column of active areas 118 where the collected light 109 is not captured by an active area.

Figure 3A:
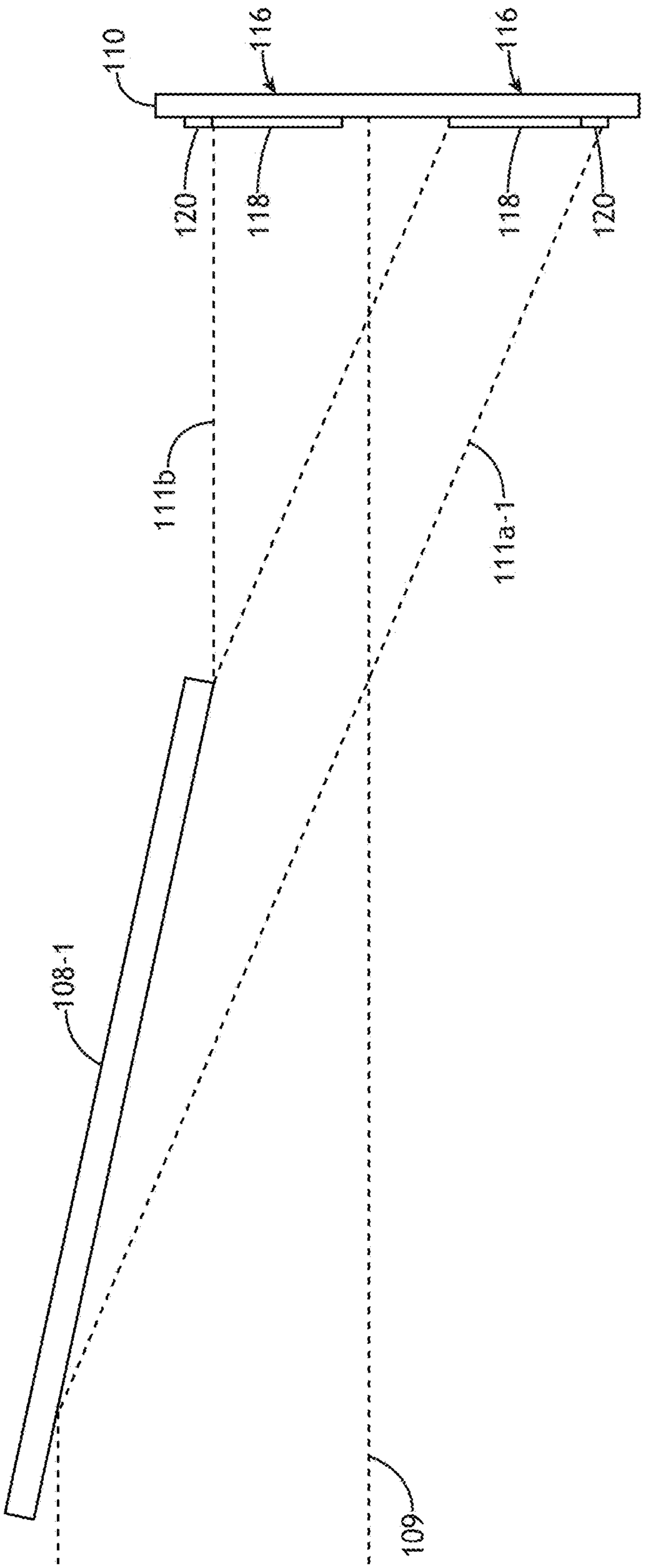
FIG. 3A depicts a top view of a grazing incidence mirror and the detector of the inspection system, in accordance with one or more embodiments of the present disclosure.
Figure 3B:
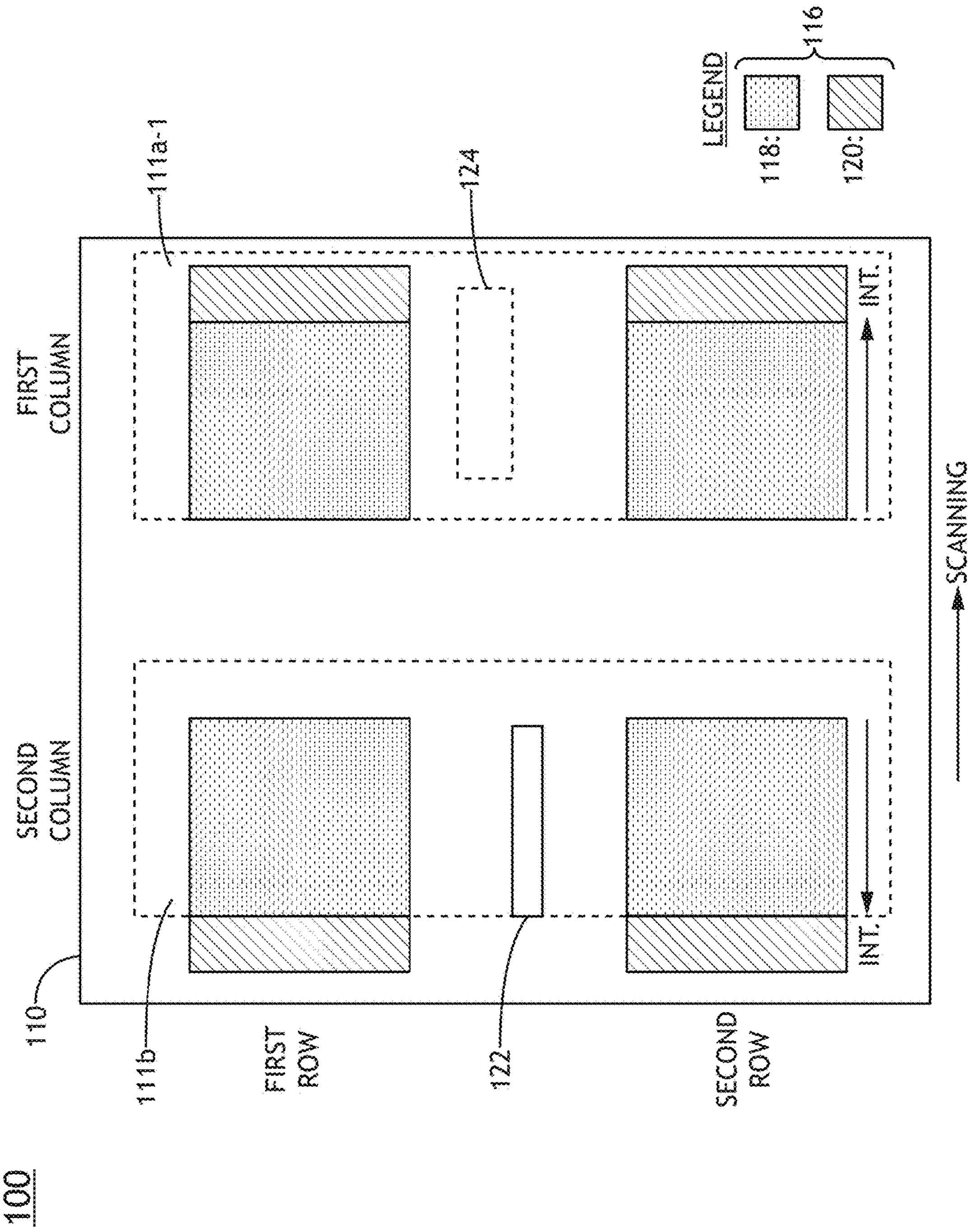
FIGS. 3B-3C depict front views of the detector of the inspection system, in accordance with one or more embodiments of the present disclosure.
Figure 3C:
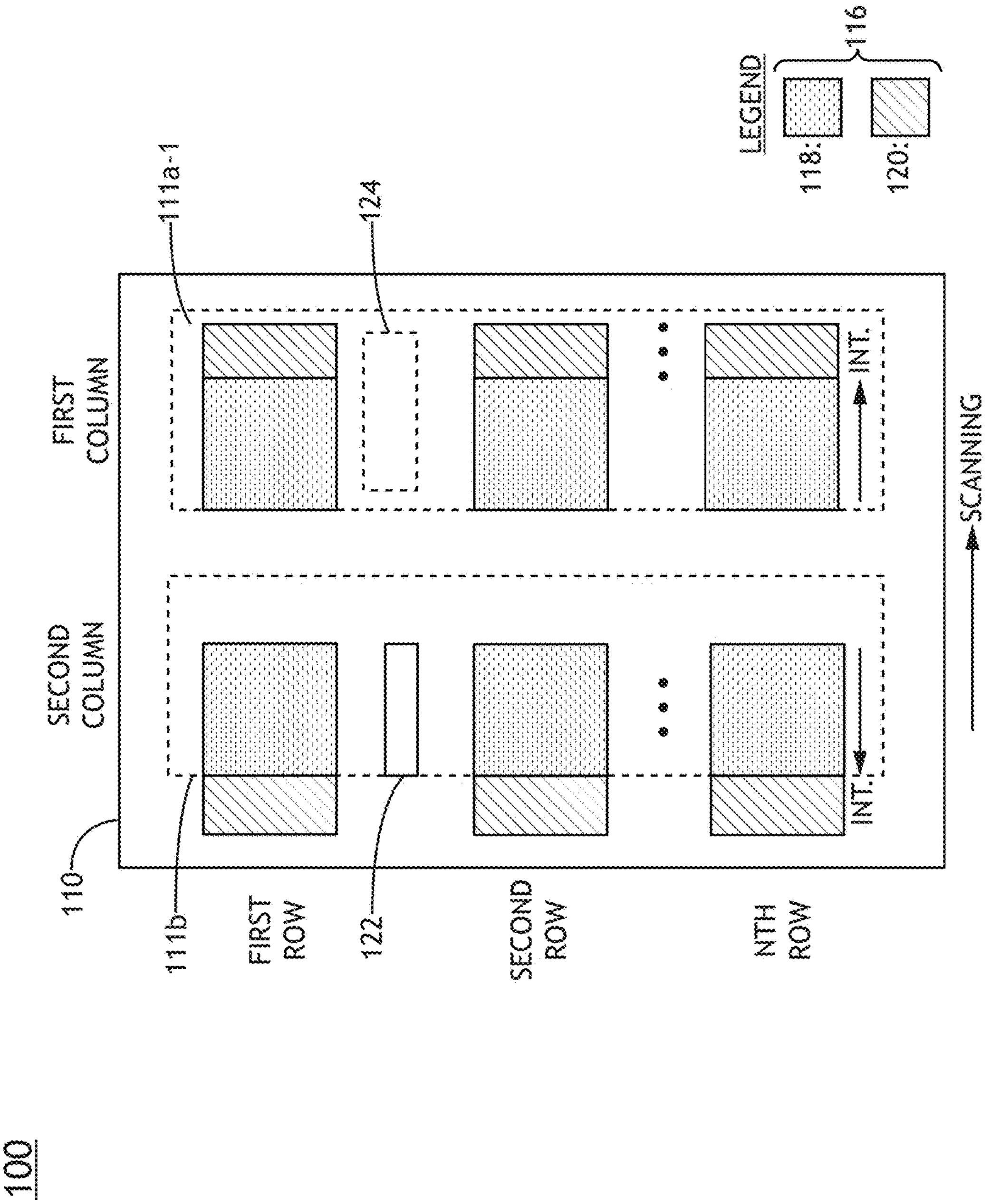

FIGS. 3A-3C depict an example of the inspection system 100 in accordance with one or more embodiments of the present disclosure. The inspection system 100 includes a first grazing incidence mirror 108-1 and the detector 110 which includes exactly two columns (e.g., first column of active areas 118, second column of active areas 118). In FIG. 3B, the detector 110 includes two rows of the active areas 118. In FIG. 3C, the detector 110 is generalized to any number N of rows of the active areas 118.

An improvement may be obtained by using only one of the grazing incidence mirrors 108 to reflect half of the collected light 109 from the imaging optics 106 into the first reflected field 111*a*-1 with the other half being the un-reflected field 111*b*. The first grazing incidence mirror 108-1 may be in the path of the collected light 109 from the imaging optics 106. The first grazing incidence mirror 108-1 may be set at an incidence angle to the collected light 109. The first grazing incidence mirror 108-1 may split the collected light 109 from the imaging optics 106 into the first reflected field 111*a*-1 and the un-reflected field 111*b*.

The discussion of the first reflected field 111*a*-1 from FIGS. 2A-2C is incorporated herein by reference as to the first reflected field 111*a*-1 of FIGS. 3A-3C.

The discussion of the second reflected field 111*a*-2 from FIGS. 2A-2C is incorporated herein by reference as to the un-reflected field 111*b* from FIGS. 3A-3C, with the following exceptions. The un-reflected field 111*b* pass adjacent to the first grazing incidence mirror 108-1 without being reflected and land on the second column of active areas 118.

The second column of active areas 118 may include the readout circuits 120 mirrored on the opposite side to the scanning direction and/or the readout circuits 120 of the first column of active areas 118. Thus, the active areas 118 may be brought closer together to reduce the grazing incidence angles required to reflect the first reflected field 111*a*-1, thereby increasing the power of the first reflected field 111*a*-1. One advantage of the inspection system 100 which includes the first grazing incidence mirror 108-1 splitting the collected light 109 from the imaging optics 106 into the first reflected field 111*a*-1 and the un-reflected field 111*b*, as compared to the first grazing incidence mirror 108-1 and the second grazing incidence mirror 108-2, may be that the spacing between the first column of active areas 118 and the second column of active areas 118 may be brought closer together because of the arrangement of the readout circuits 120 on opposing sides. Additionally, the power of the un-reflected field 111*b* may be higher than the second reflected field 111*a*-2 due to not losing power from reflecting from the second grazing incidence mirror 108-2. The inspection system 100 which includes the first grazing incidence mirror 108-1 may also provide the benefits of reducing the wasted field around and/or between the active areas 118.

In this configuration of the grazing incidence mirrors 108 and the detector 110, the active areas 118 may be disposed between the readout circuits 120. The width of the active areas 118 may be increased in the scanning direction due to the active areas 118 being disposed between the readout circuits 120. Thus, the active areas 118 may be an oblong shape with a width which is longer than the height. For example, the width of the active areas 118 may be increased by 25% of the height in the scanning direction, such that the active areas 118 are oblong rectangles. Assuming, a reflectivity of 92% at 7.1 deg for the first reflected field 111*a*-1, and 100% transmission for the un-reflected field, and the 25% increase in width, the detector 110 may experience a 120% improvement ((0.92+1.0)/2*1.25) as compared to the detector 110 being used without the grazing incidence mirrors 108. These improvements depend on the assumptions which can vary, although the numbers used are thought to be representative. The benefits can be larger or smaller depending on the grazing incidence angle and associated losses, the distance needed to fit the readout circuits 120, and/or the size of the active areas 118.

Figure 4A:
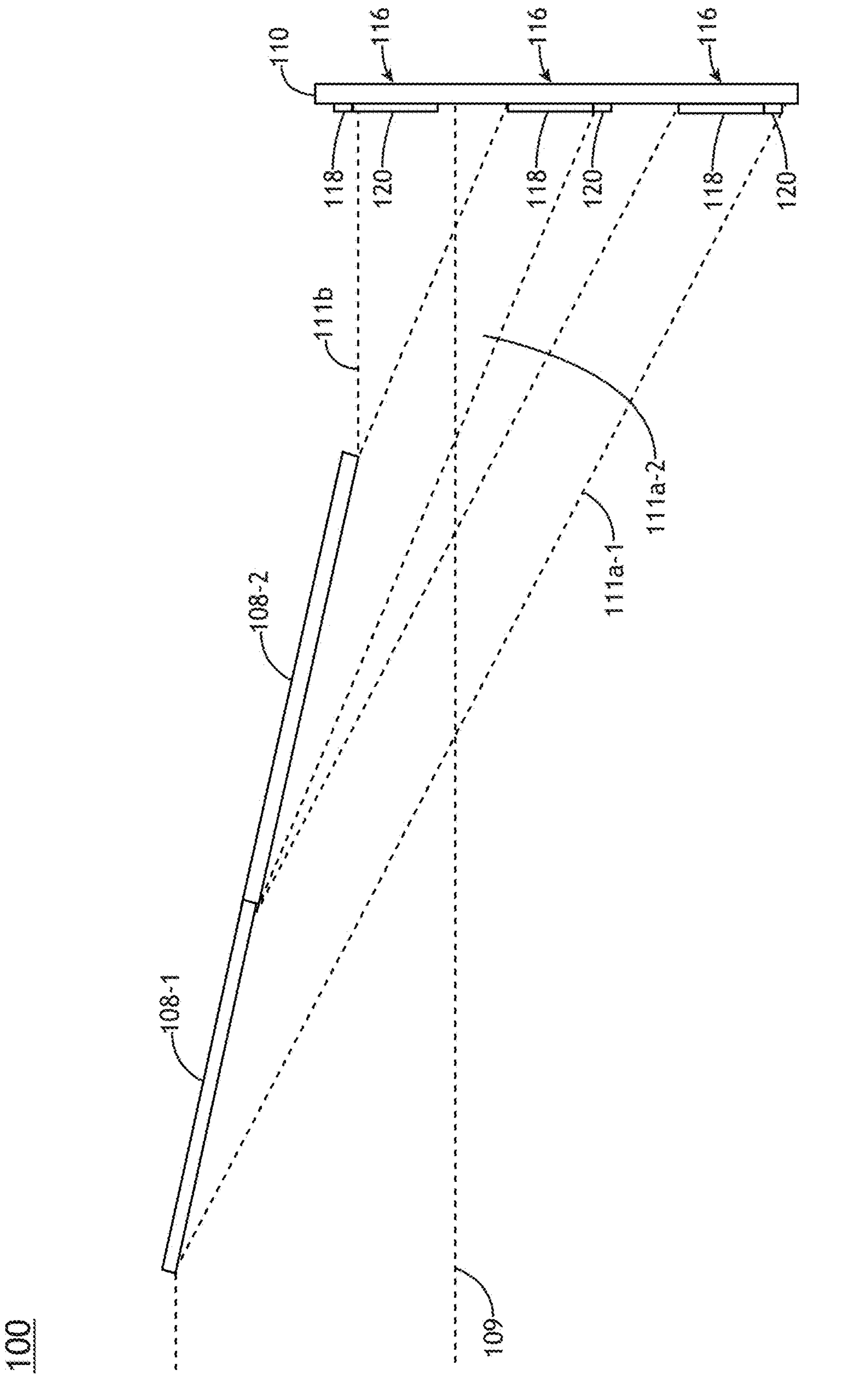
FIG. 4A depicts a top view of grazing incidence mirrors and the detector of the inspection system, in accordance with one or more embodiments of the present disclosure.
Figure 4B:
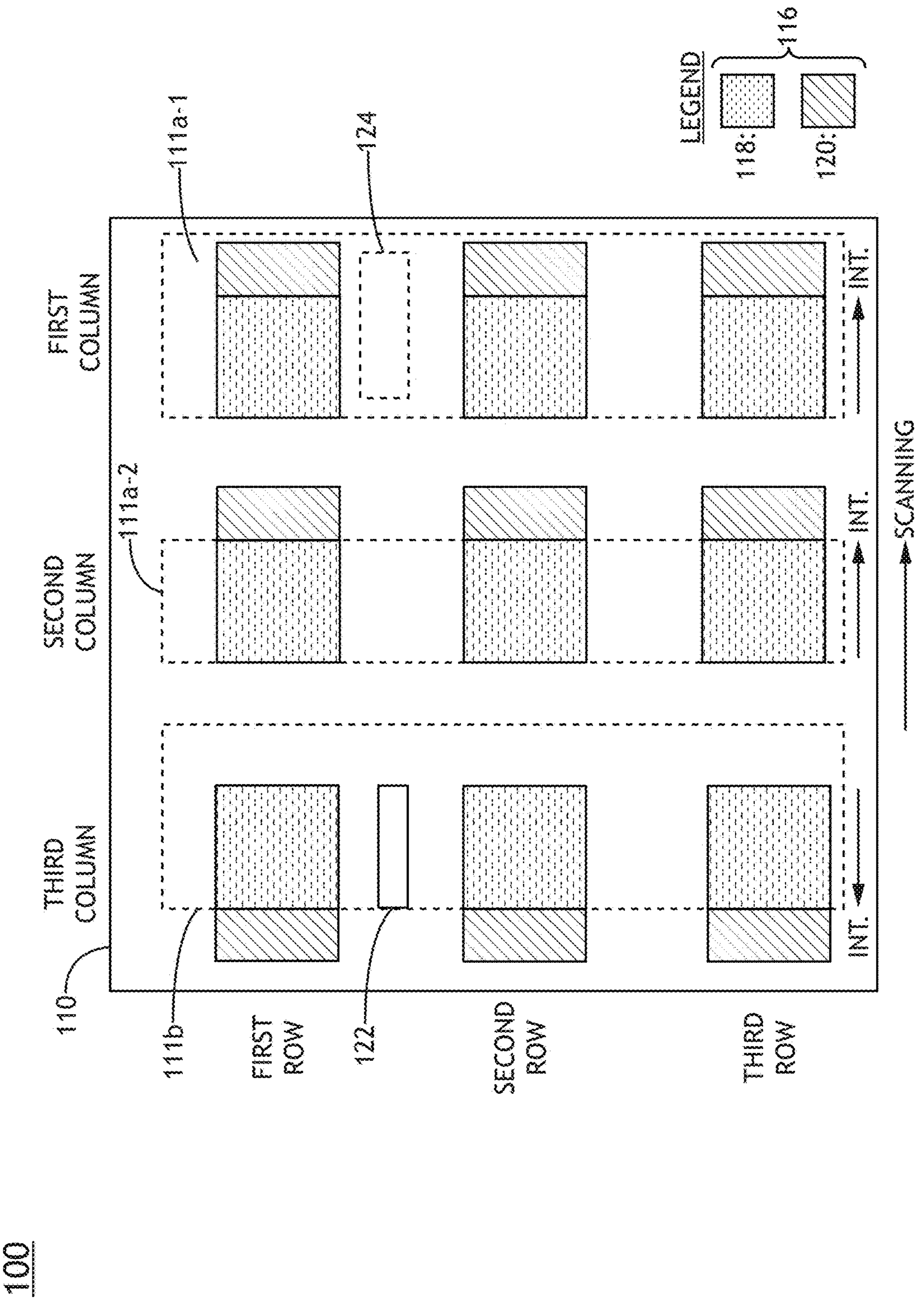
FIG. 4B depicts a front view of the detector of the inspection system, in accordance with one or more embodiments of the present disclosure.

FIGS. 4A-4B depict an example of the inspection system 100 in accordance with one or more embodiments of the present disclosure. The inspection system 100 includes the first grazing incidence mirror 108-1, the second grazing incidence mirror 108-2, and the detector 110 which includes three columns (e.g., first column of active areas 118, second column of active areas 118, third column of active areas 118). In this example, the detector 110 includes three rows of the active areas 118, although this may be generalized for any number N of the rows of the active areas 118. This example further illustrates how the grazing incidence mirrors 108 may be scaled to accommodate any number M of the columns of the active areas 118. One limiting factor of the number M of the columns may be the power losses associated with higher angles of incidence. Thus, it is contemplated that including two or three of the columns may provide the most benefit when comparing the power loss associated with the reflection with the power gained from increasing the collection area.

The discussion of the first reflected field 111*a*-1 and the second reflected field 111*a*-2 from FIGS. 2A-2C are incorporated herein by reference as to the first reflected field 111*a*-1 and the second reflected field 111*a*-2, respectively, of FIGS. 4A-4B. The discussion of the un-reflected field 111*b* from FIGS. 3A-3C are incorporated herein by reference as to the un-reflected field 111*b* of FIGS. 4A-4B.

Figure 5A:
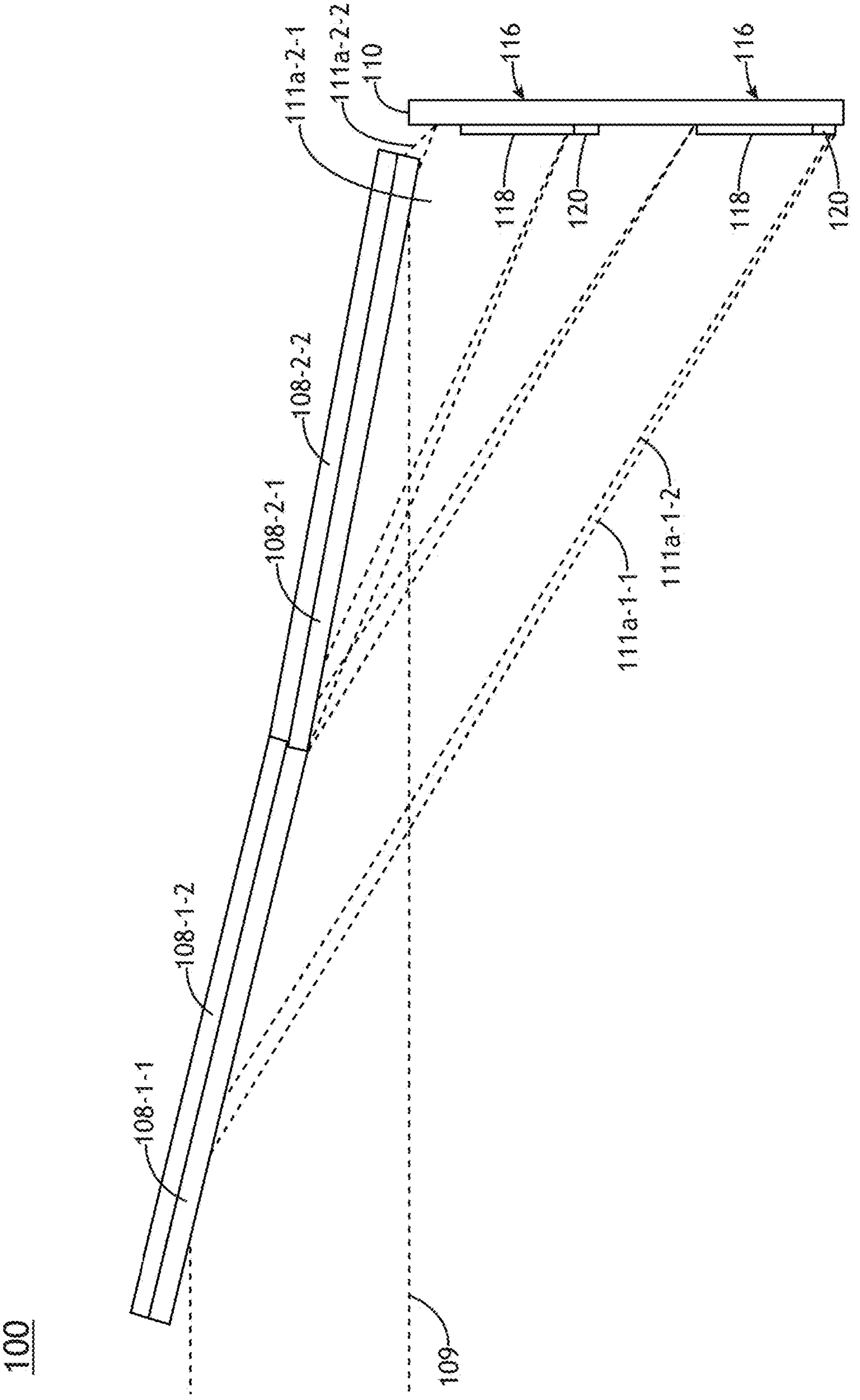
FIG. 5A depicts a top view of grazing incidence mirrors and the detector of the inspection system, in accordance with one or more embodiments of the present disclosure.
Figure 5B:
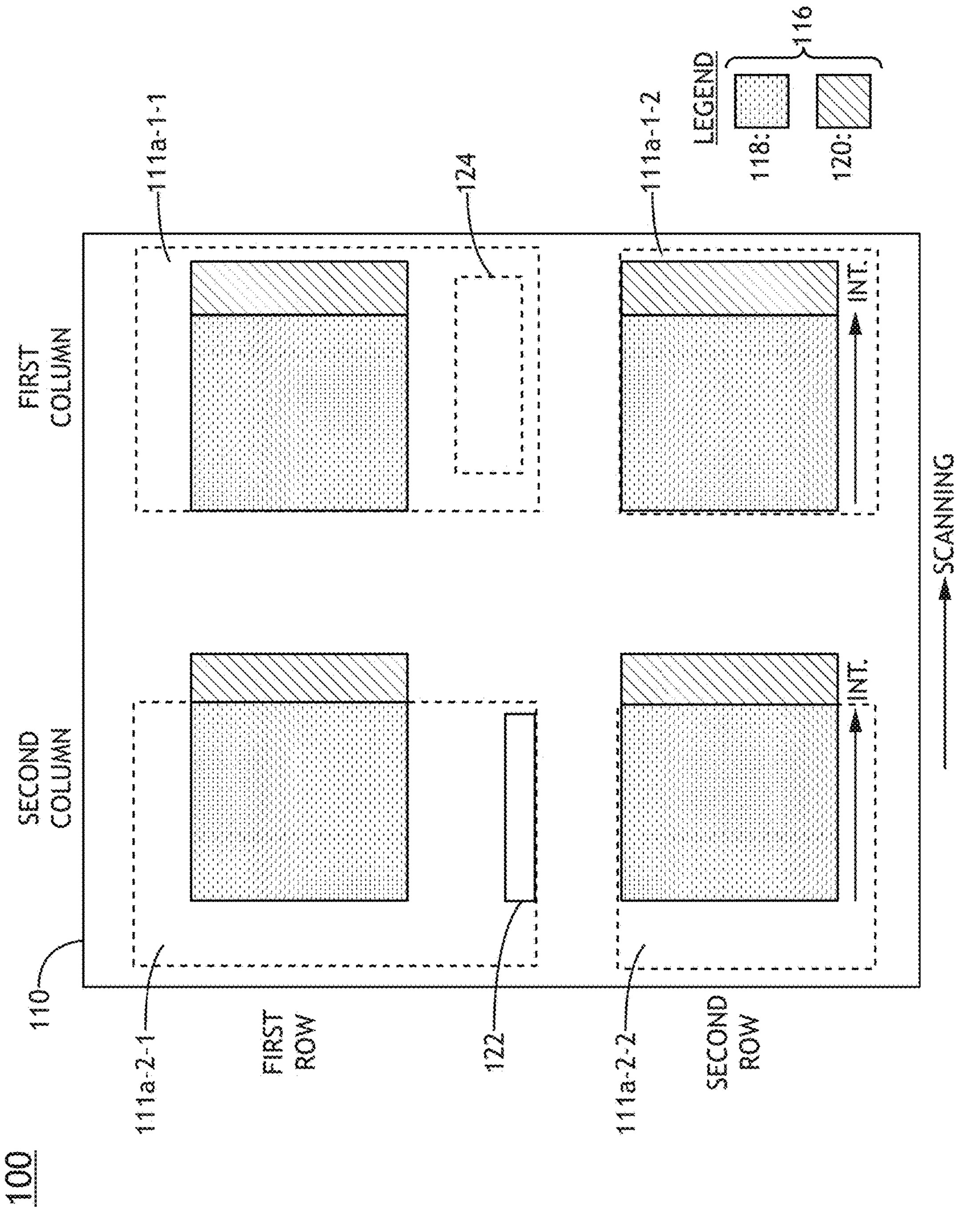
FIG. 5B depicts a front view of the detector of the inspection system, in accordance with one or more embodiments of the present disclosure.

FIGS. 5A-5B depict an example of the inspection system 100 in accordance with one or more embodiments of the present disclosure. The detector 110 may include two rows and two columns of the active areas 118. The grazing incidence mirrors 108 may be configured to split the fields 111 along both the rows and the columns. For example, the grazing incidence mirrors 108 include a tip angle and a tilt angle which form the grazing incidence angle. The tip angle and the tilt angle may split the fields 111 along the columns and rows, respectively. This configuration may compress the collected light 109 from the imaging optics 106 in the swathing direction orthogonal to the scanning direction.

In this example, the inspection system 100 may include a first-column first-row 108-1-1, a first-column second-row grazing incidence mirror 108-1-2, a second-column first-row grazing incidence mirror 108-2-1, and a second-column second-row grazing incidence mirror 108-2-2. The first-column first-row 108-1-1 and the first-columns second-row grazing incidence mirror 108-1-2 may be disposed at the same position from the detector 110 and with the same tilt angle but with different tip angles. Similarly, the second-column first-row grazing incidence mirror 108-2-1 and the second-column second-row grazing incidence mirror 108-2-2 may be disposed at the same position from the detector 110 and with the same tilt angle but with different tip angles. The first-column first-row 108-1-1, the first-column second-row grazing incidence mirror 108-1-2, the second-column first-row grazing incidence mirror 108-2-1, and the second-column second-row grazing incidence mirror 108-2-2 may split the collected light 109 from the imaging optics 106 into respective of a first-column first-row reflected field 111*a*-1-1, a first-column second-row reflected field 111*a*-1-2, a second-column first-row reflected field 111*a*-2-1, and a second-column second-row reflected field 111*a*-2-2 which may land on respective columns and rows of the active areas 118. In this example, a portion of the second-column first-row reflected field 111*a*-2-1 may also land between the rows on the circuits 122 for reference correction purposes.

Figure 6:
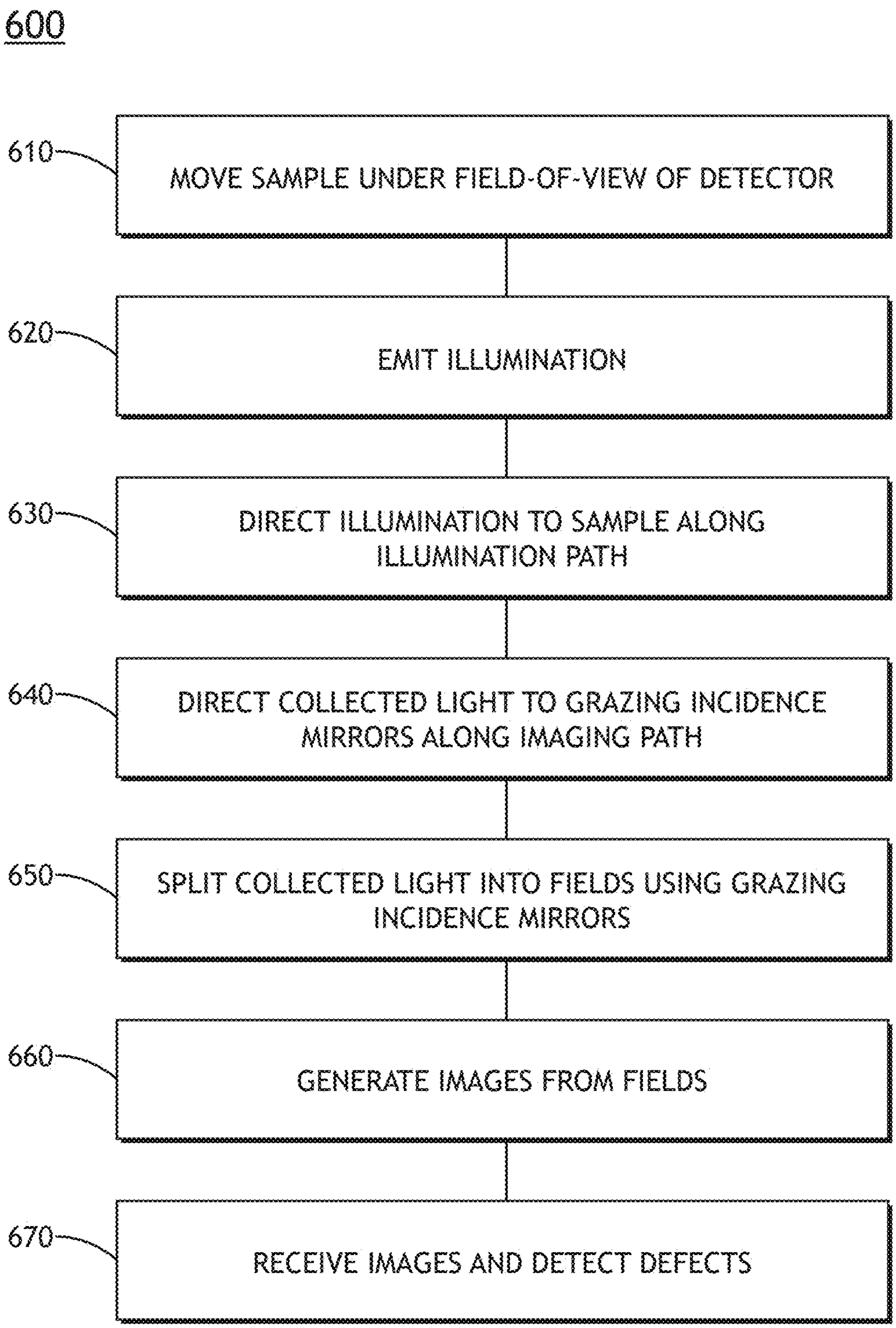
FIG. 6 depicts a flow diagram of a method, in accordance with one or more embodiments of the present disclosure.

FIG. 6 depicts a flow diagram of a method 600, in accordance with one or more embodiments of the present disclosure. The embodiments and the enabling technologies described previously herein in the context of the inspection system 100 should be interpreted to extend to the method. It is further noted, however, that the method 600 is not limited to the architecture of the inspection system 100.

In a step 610, a stage may move a sample under a field-of-view of a detector. For example, the stage 112 may move the sample 103 under a field-of-view of the detector 110. The stage 112 may move the sample 103 as a scanning process.

In a step 620, illumination may be emitted by a source sub-system. For example, the illumination 101 may be emitted by the source sub-system 102. The illumination 101 may be vacuum ultraviolet light. For example, the illumination 101 may be EUV light (e.g., in-band EUV light).

In a step 630, illumination optics may direct the illumination to a sample. For example, the illumination optics 104 may direct the illumination 101 to the sample 103 and illuminate the sample 103 with the illumination 101. The illumination 101 may be directed along the illumination path 105. The illumination optics 104 may also process and shape the illumination 101 prior to directing onto the sample 103.

In a step 640, the illumination may reflect from the sample as the collected light and be directed by imaging optics to one or more grazing incidence mirrors. For example, the illumination 101 may reflect from the sample 103 as the collected light 109 and be directed by the imaging optics 106 to the grazing incidence mirrors 108. The collected light 109 may be directed along the imaging path 107. The imaging optics 106 may also magnify the collected light 109.

In a step 650, the one or more grazing incidence mirrors may split the collected light into at least two fields. For example, the grazing incidence mirrors 108 may split the collected light 109 from the imaging optics 106 into at least two of the fields 111. The fields 111 may include one or more of the reflected fields 111*a*. For example, the fields 111 may include two or more of the reflected fields 111*a*. By way of another example, the fields 111 may include one or more of the reflected fields 111*a* and the un-reflected field 111*b*. The grazing incidence mirrors 108 may be disposed in a path of the one or more of the reflected fields 111*a* such that the one or more of the reflected fields 111*a* reflect from the grazing incidence mirrors 108.

In a step 660, a detector may generate one or more images from the at least two fields. For example, the detector 110 may generate the images 113 from the fields 111. The detector 110 may include the time-delay-integration sensors 116. The time-delay-integration sensors 116 may include the active areas 118 and the readout circuits 120. The active areas 118 may be arranged in the array of columns and rows. The fields 111 may land on separate of the columns of the active areas 118. At least a portion of the detector 110 between the columns of the active areas 118 may not receive the collected light 109 from the imaging optics 106. The readout circuits 120 may readout charges from the active areas 118 as lines of the images 113. The detector 110 may also synchronize a charge transfer rate along the rows of the active areas 118 with the rate at which the sample 103 is scanned.

In a step 670, a controller may receive the one or more images and detect one or more defects based on the one or more images. For example, the controller 114 may receive the images 113 and detect defects based on the images 113.

Referring generally again to the figures. The reflected fields 111*a* may experience field distortion. The un-reflected field 111*b* may not experience the field distortion. For example, the reflected fields 111*a* may be elongated by a cosine factor in the corresponding to the grazing incidence angles of the grazing incidence mirrors 108. The elongation may be mitigated by tilting the detector 110 as a unit and/or tilting the time-delay-integration sensors 116 individually to face the reflected fields 111*a*.

A controller may include one or more controllers housed in a common housing or within multiple housings. In this way, any controller or combination of controllers may be separately packaged as a module suitable for integration into a system. Further, the controllers may analyze data received from detectors and feed the data to additional components within the system or external to the system.

The controller may include one or more processors configured to execute program instructions maintained on a memory medium, causing the controller to perform any of the various methods.

The one or more processors may include any processor or processing element known in the art. For the purposes of the present disclosure, the term "processor" or "processing element" may be broadly defined to encompass any device having one or more processing or logic elements (e.g., one or more micro-processor devices, one or more application specific integrated circuit (ASIC) devices, one or more field programmable gate arrays (FPGAs), or one or more digital signal processors (DSPs)). In this sense, the one or more processors may include any device configured to execute algorithms and/or instructions (e.g., program instructions stored in memory). In one embodiment, the one or more processors may be embodied as a desktop computer, mainframe computer system, workstation, image computer, parallel processor, networked computer, or any other computer system configured to execute a program configured to operate or operate in conjunction with the systems, as described throughout the present disclosure The memory medium may include any storage medium known in the art suitable for storing program instructions executable by the associated one or more processors. For example, the memory medium may include a non-transitory memory medium. By way of another example, the memory medium may include, but is not limited to, a read-only memory (ROM), a random-access memory (RAM), a magnetic or optical memory device (e.g., disk), a magnetic tape, a solid-state drive and the like. It is further noted that memory medium may be housed in a common controller housing with the one or more processors. In one embodiment, the memory medium may be located remotely with respect to the physical location of the one or more processors and controller. For instance, the one or more processors of controller may access a remote memory (e.g., server), accessible through a network (e.g., internet, intranet and the like).

It is further contemplated that each of the embodiments of the methods described above may include any other step(s) of any other method(s) described herein. In addition, each of the embodiments of the method described above may be performed by any of the systems described herein.

It is noted herein that the one or more components of the system may be communicatively coupled to the various other components of system in any manner known in the art. For example, the one or more processors may be communicatively coupled to each other and other components via a wireline (e.g., copper wire, fiber optic cable, and the like) or wireless connection (e.g., RF coupling, IR coupling, WiMax, Bluetooth, 3G, 4G, 4G LTE, 5G, and the like). By way of another example, the controller may be communicatively coupled to one or more components of the system via any wireline or wireless connection known in the art.

One skilled in the art will recognize that the herein described components operations, devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components, operations, devices, and objects should not be taken as limiting.

As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mixable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. An inspection system comprising:

one or more grazing incidence mirrors, wherein the one or more grazing incidence mirrors are configured to split a collected light into at least two fields, wherein the at least two fields include one or more reflected fields, wherein the one or more grazing incidence mirrors are disposed in a path of the one or more reflected fields such that the one or more reflected fields reflect from the one or more grazing incidence mirrors; and a detector, wherein the detector is configured to generate one or more images from the at least two fields, wherein the detector includes a plurality of time-delay-integration sensors, wherein the plurality of time-delay-integration sensors include a plurality of active areas and a plurality of readout circuits, wherein the plurality of active areas are arranged in an array of columns and rows, wherein the at least two fields are configured to land on separate of the columns of the plurality of active areas, wherein at least a portion of the detector between the columns of the plurality of active areas does not receive the collected light, wherein the plurality of readout circuits are configured to readout charges from the plurality of active areas as lines of the one or more images.

2. The inspection system of claim 1, wherein the collected light is extreme ultraviolet light.

3. The inspection system of claim 1, wherein the collected light is in-band EUV light having a wavelength of 13.5 nm.

4. The inspection system of claim 1, wherein the one or more grazing incidence mirrors are a last reflective optics in an imaging path before the detector.

5. The inspection system of claim 1, wherein the one or more grazing incidence mirrors include at least one of ruthenium, molybdenum, or niobium.

6. The inspection system of claim 1, wherein the one or more grazing incidence mirrors are at one or more grazing incidence angles, wherein the one or more grazing incidence angles are between 0 and 20 degrees.

7. The inspection system of claim 6, wherein the one or more grazing incidence angles are between 5 and 9 degrees.

8. The inspection system of claim 1, wherein the one or more grazing incidence mirrors are plano mirrors.

9. The inspection system of claim 1, wherein the one or more grazing incidence mirrors are curved mirrors.

10. The inspection system of claim 1, wherein the plurality of time-delay-integration sensors are configured in one of a rectangular lattice or a square lattice.

11. The inspection system of claim 1, wherein the plurality of active areas include a buffer of the collected light along edges of the at least two fields which are not split by the one or more grazing incidence mirrors.

12. The inspection system of claim 1, wherein the one or more grazing incidence mirrors include at least two grazing incidence mirrors, wherein the at least two grazing incidence mirrors split the collected light into at least two reflected fields.

13. The inspection system of claim 1, wherein the at least two fields include the one or more reflected fields and an un-reflected field, wherein the one or more grazing incidence mirrors are not disposed in a path of the un-reflected field such that the un-reflected field does not reflect from the one or more grazing incidence mirrors.

14. The inspection system of claim 13, wherein the plurality of active areas which receive the one or more reflected fields and the plurality of active areas which receive the un-reflected field integrate the charges in opposite directions.

15. The inspection system of claim 14, wherein the plurality of active areas are arranged in exactly two columns, wherein the plurality of active areas are disposed between the plurality of readout circuits.

16. The inspection system of claim 15, wherein the plurality of active areas are oblong rectangles.

17. The inspection system of claim 1, wherein the at least two fields include at least four fields, wherein the at least four fields are configured to land on separate of the columns and separate of the rows.

18. The inspection system of claim 1, further comprising:
- a source sub-system configured to emit illumination, wherein the illumination is vacuum ultraviolet light;
- illumination optics configured to direct the illumination to a sample, wherein the illumination is configured to reflect from the sample as the collected light;
- a stage, wherein the stage is configured to support the sample; and
- imaging optics configured to direct the collected light to the one or more grazing incidence mirrors, wherein the imaging optics magnify the collected light.

19. The inspection system of claim 18, wherein the collected light reflects from the sample off-axis to the illumination.

20. The inspection system of claim 18, wherein the collected light is configured to scan over the sample in a scanning direction; wherein the plurality of active areas which receive the one or more reflected fields integrate the charges along the scanning direction.

21. The inspection system of claim 18, wherein the illumination optics comprise one or more reference correctors, wherein the one or more reference correctors form a reference corrector shadow, wherein the reference corrector shadow is conjugate to a position between at least two rows of the plurality of active areas and within at least a portion of the at least two fields.

22. The inspection system of claim 1, further comprising a controller configured to receive the one or more images and detect one or more defects based on the one or more images.

23. An inspection system comprising:
- a source sub-system configured to emit illumination, wherein the illumination is vacuum ultraviolet light;
- illumination optics configured to direct the illumination to a sample, wherein the illumination is configured to reflect from the sample as collected light;
- a stage, wherein the stage is configured to support the sample;
- imaging optics configured to direct the collected light to one or more grazing incidence mirrors, wherein the imaging optics magnify the collected light;
- the one or more grazing incidence mirrors, wherein the one or more grazing incidence mirrors are configured to split the collected light into at least two fields, wherein the at least two fields include one or more reflected fields, wherein the one or more grazing incidence mirrors are disposed in a path of the one or more reflected fields such that the one or more reflected fields reflect from the one or more grazing incidence mirrors;
- a detector, wherein the detector is configured to generate one or more images from the at least two fields, wherein the detector includes a plurality of time-delay-integration sensors, wherein the plurality of time-delay-integration sensors include a plurality of active areas and a plurality of readout circuits, wherein the plurality of active areas are arranged in an array of columns and rows, wherein the at least two fields are configured to land on separate of the columns of the plurality of active areas, wherein at least a portion of the detector between the columns of the plurality of active areas does not receive the collected light, wherein the plurality of readout circuits are configured to readout charges from the plurality of active areas as lines of the one or more images; and
- a controller configured to receive the one or more images and detect one or more defects based on the one or more images.

24. A method comprising:
- splitting a collected light into at least two fields, wherein the collected light is split into the at least two fields using one or more grazing incidence mirrors, wherein the at least two fields include one or more reflected fields, wherein the one or more grazing incidence mirrors are disposed in a path of the one or more reflected fields such that the one or more reflected fields reflect from the one or more grazing incidence mirrors; and
- generating one or more images from the at least two fields, wherein the one or more images are generated using a detector, wherein the detector includes a plurality of time-delay-integration sensors, wherein the plurality of time-delay-integration sensors include a plurality of active areas and a plurality of readout circuits, wherein the plurality of active areas are arranged in an array of columns and rows, wherein the at least two fields are configured to land on separate of the columns of the plurality of active areas, wherein at least a portion of the detector between the columns of the plurality of active areas does not receive the collected light, wherein the plurality of readout circuits are configured to readout charges from the plurality of active areas as lines of the one or more images.

* * * * *